United States Patent
Cho et al.

(10) Patent No.: US 12,164,183 B2
(45) Date of Patent: Dec. 10, 2024

(54) NANO STRUCTURE FOR CONTROLLING OPTICAL PROPERTIES OF OPTICAL DEVICE AND METHOD FOR MANUFACTURING THE SAME

(71) Applicant: ELECTRONICS AND TELECOMMUNICATIONS RESEARCH INSTITUTE, Daejeon (KR)

(72) Inventors: Doo-Hee Cho, Daejeon (KR); Byoung-Hwa Kwon, Daejeon (KR); Young Sam Park, Daejeon (KR); Jin Wook Shin, Daejeon (KR); Nam Sung Cho, Daejeon (KR); Hyunsu Cho, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 567 days.

(21) Appl. No.: 17/492,387

(22) Filed: Oct. 1, 2021

(65) Prior Publication Data

US 2022/0137436 A1 May 5, 2022

(30) Foreign Application Priority Data

Nov. 3, 2020 (KR) .................. 10-2020-0145198

(51) Int. Cl.
| | |
|---|---|
| *G02B 5/00* | (2006.01) |
| *B82B 3/00* | (2006.01) |
| *B82Y 20/00* | (2011.01) |
| *G02F 1/00* | (2006.01) |

(52) U.S. Cl.
CPC .......... *G02F 1/0063* (2013.01); *B82B 3/0014* (2013.01); *B82Y 20/00* (2013.01)

(58) Field of Classification Search
CPC ................................ G02F 1/0063; G02B 5/00
See application file for complete search history.

(56) References Cited

U.S. PATENT DOCUMENTS

| | | | |
|---|---|---|---|
| 9,885,874 B2 | 2/2018 | Yun et al. | |
| 10,481,420 B2 | 11/2019 | Bonod et al. | |
| 10,509,145 B2 | 12/2019 | Park et al. | |
| 2011/0117686 A1* | 5/2011 | Zhang | H01L 33/44 438/27 |

(Continued)

FOREIGN PATENT DOCUMENTS

| | | |
|---|---|---|
| CN | 106932846 A | 7/2017 |
| KR | 10-20100013504 A | 2/2010 |

(Continued)

OTHER PUBLICATIONS

Young-Sam Park et al., "Crystallization-assisted nano-lens array fabrication for highly efficient and color stable organic light emitting diodes", Nanoscale, 2017.

*Primary Examiner* — Joseph P Martinez

(57) ABSTRACT

Provided is a nano structure for controlling optical properties of an optical device. The nano structure includes a substrate, a surface modification layer provided on the substrate to modify surface energy of the substrate, and a capping layer provided on the surface modification layer. The capping layer includes a convex portion having a convex profile away from the surface modification layer and a concave portion that is in contact with the surface modification layer.

12 Claims, 8 Drawing Sheets

(56) References Cited

U.S. PATENT DOCUMENTS

2013/0186466 A1 7/2013 Hebrink et al.
2019/0187537 A1 6/2019 Kim et al.

FOREIGN PATENT DOCUMENTS

| KR | 10-2017-0003824 A | 1/2017 |
| KR | 101711551 B1 | 3/2017 |
| KR | 101894982 B1 | 9/2018 |
| KR | 10-2019-0004642 A | 1/2019 |
| KR | 10-2019-0120456 A | 10/2019 |

* cited by examiner

NANO STRUCTURE FOR CONTROLLING OPTICAL PROPERTIES OF OPTICAL DEVICE AND METHOD FOR MANUFACTURING THE SAME

CROSS-REFERENCE TO RELATED APPLICATIONS

This U.S. non-provisional patent application claims priority under 35 U.S.C. § 119 of Korean Patent Application No. 10-2020-0145198, filed on Nov. 3, 2020, the entire contents of which are hereby incorporated by reference.

BACKGROUND

The present disclosure herein relates to a nano structure for controlling optical properties of an optical device and a method for manufacturing the same, and more particularly, to a nano structure including a capping layer having a convex portion and a method for manufacturing the same.

Optical devices may be classified into various types according to fields such as light emitting devices, photoelectric devices such as photodiodes, optical fibers, and optical filters, and optical properties required for the optical devices are also different according to characteristics of the respective fields.

A nano structure may be provided on a surface of the optical device to control optical properties of the optical device. For example, a nano structure is formed on a surface of an organic light emitting diode (OLED) to cause light extraction or light scattering, thereby improving efficiency of the organic light emitting diode and also improving viewing angle characteristics.

A hemispherical nano structure may be formed on the optical device. The hemispherical nano structure may be adjusted in size and curvature radius to improve the optical properties of the optical device. The hemispherical nano structure may be formed through a photolithography process, an imprint process, or the like, but has a limitation in that the process is complicated, and manufacturing cost is high. In addition, most organic materials used in the nano structure have a high refractive index and low durability.

SUMMARY

The present disclosure provides a nano structure formed using a deposition method and capable of improving durability and optical properties of an optical device.

Technical objects to be solved by the present invention are not limited to the aforementioned technical objects and unmentioned technical objects will be clearly understood by those skilled in the art from the specification and the appended claims.

An embodiment of the inventive concept provides a nano structure for controlling optical properties of an optical device, the nano structure including: a substrate; a surface modification layer provided on the substrate to modify surface energy of the substrate; and a capping layer provided on the surface modification layer, wherein the capping layer includes: a convex portion having a convex profile away from the surface modification layer; and a concave portion that is in contact with the surface modification layer.

In an embodiment of the inventive concept, a method for manufacturing a nano structure for controlling optical properties of an optical device includes: forming a surface modification layer, which modifies surface energy of a substrate, on the substrate; forming an island pattern on the surface modification layer; and forming a capping layer on the island pattern, wherein the capping layer includes: a convex portion configured to cover a top surface of the island pattern; and a concave portion that is in contact with the surface modification layer.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
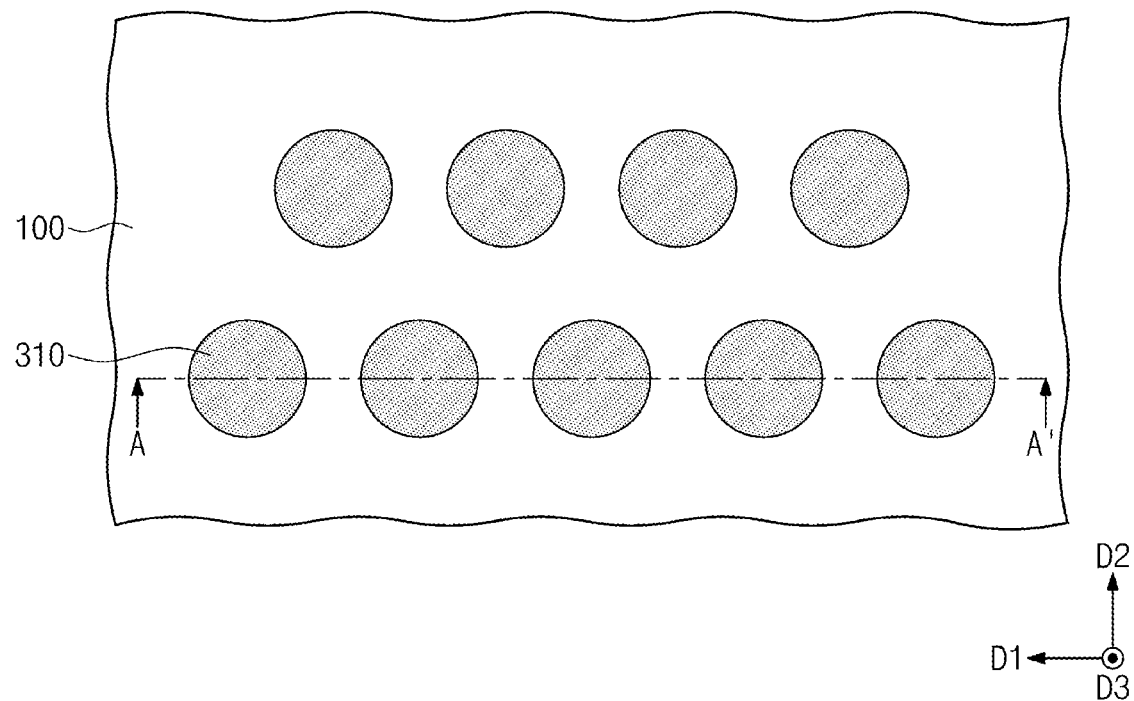
FIG. 1 is a plan view for explaining a nano structure according to embodiments of the inventive concept.

The present invention is not limited to the embodiments disclosed below, but should be implemented in various forms, and various modifications and changes may be made. Rather, these embodiments are provided so that this disclosure will be thorough and complete, and will fully convey the scope of the present invention to those skilled in the art. Further, the present invention is only defined by scopes of claims. In the accompanying drawings, the components are shown enlarged for the sake of convenience of explanation, and the proportions of the components may be exaggerated or reduced for clarity of illustration.

In the following description, the technical terms are used only for explaining a specific exemplary embodiment while not limiting the present invention. Unless terms used in embodiments of the present invention are differently defined, the terms may be construed as meanings that are commonly known to a person skilled in the art.

In the following description, the technical terms are used only for explaining a specific exemplary embodiment while not limiting the present invention. In this specification, the terms of a singular form may include plural forms unless specifically mentioned. The meaning of 'comprises' and/or 'comprising' specifies a component, a step, an operation and/or an element does not exclude other components, steps, operations and/or elements.

When a layer is referred to herein as being 'on' another layer, it may be formed directly on the top of the other layer or a third layer may be interposed between them.

An embodiment described and exemplified herein includes a complementary embodiment thereof. Like reference numerals refer to like elements throughout.

Hereinafter, a nano structure according to embodiments of the inventive concept will be described in detail with reference to the drawings.

Figure 2:
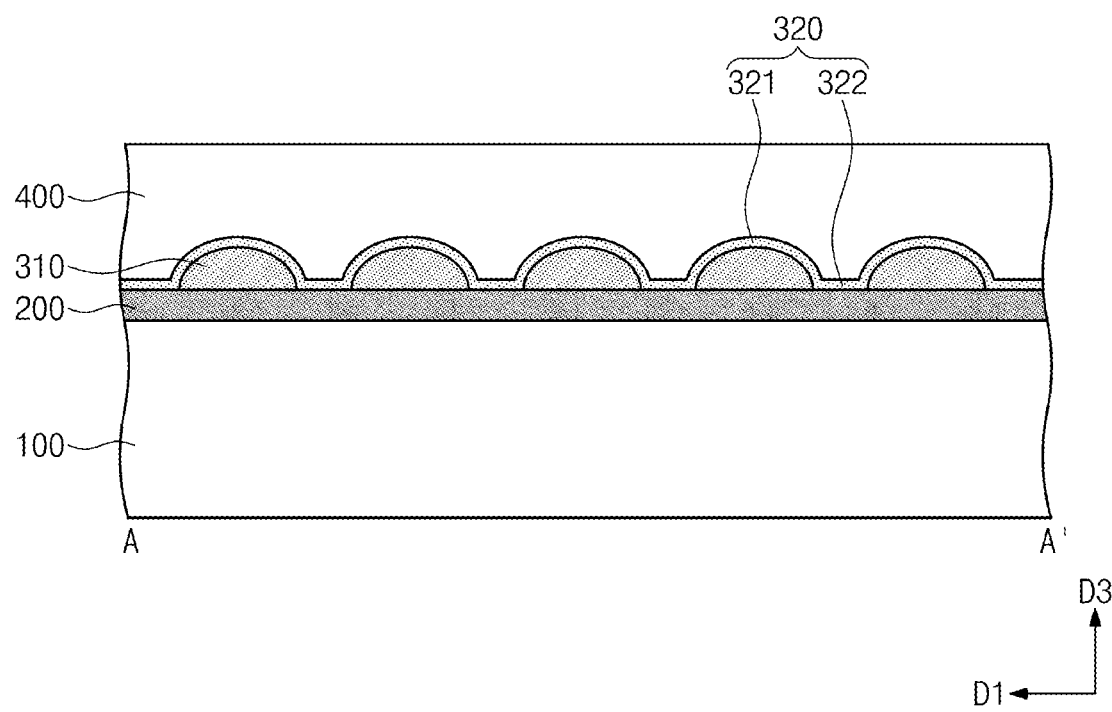
FIG. 2 is a cross-sectional view taken along line A-A' of FIG. 1.

FIG. 1 is a plan view for explaining a nano structure according to embodiments of the inventive concept. FIG. 2 is a cross-sectional view taken along line A-A' of FIG. 1.

Referring to FIGS. 1 to 2, a surface modification layer 200 may be provided on a substrate 100. For example, the substrate 100 may include at least one of materials such as glass, silicon, sapphire, polyimide, polyethylene terephthalate (PET), polystyrene (PS), polycarbonate (PC), polyvinyl chloride (PVC), and stainless steel, but a material forming the substrate 100 is not limited thereto.

As another example, the substrate 100 may be an uppermost layer defining a plate-type or film-type optical device such as an organic light emitting diode (OLED) or a photodiode (PD). In other words, a surface modification layer 200 to be described later may be provided on the uppermost layer constituting the optical device.

The surface modification layer 200 may be provided on the substrate 100 to modify surface energy of the substrate 100. An island pattern 310 may be provided on the surface modification layer 200. The island pattern 310 may be provided in a hemispherical shape on the substrate 100 by the surface modification layer 200. Hereinafter, a function of the surface modification layer 200 will be described in more detail with reference to FIGS. 3A to 3C and FIGS. 4A to 4C.

Figure 3A:
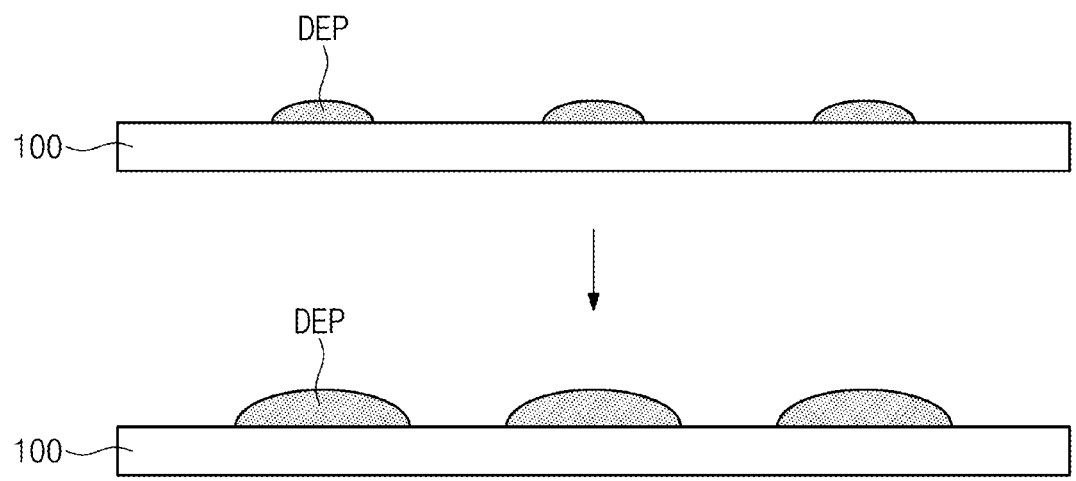
FIGS. 3A to 3C are cross-sectional views illustrating a mechanism when a deposition material is formed on a substrate.
Figure 3B:
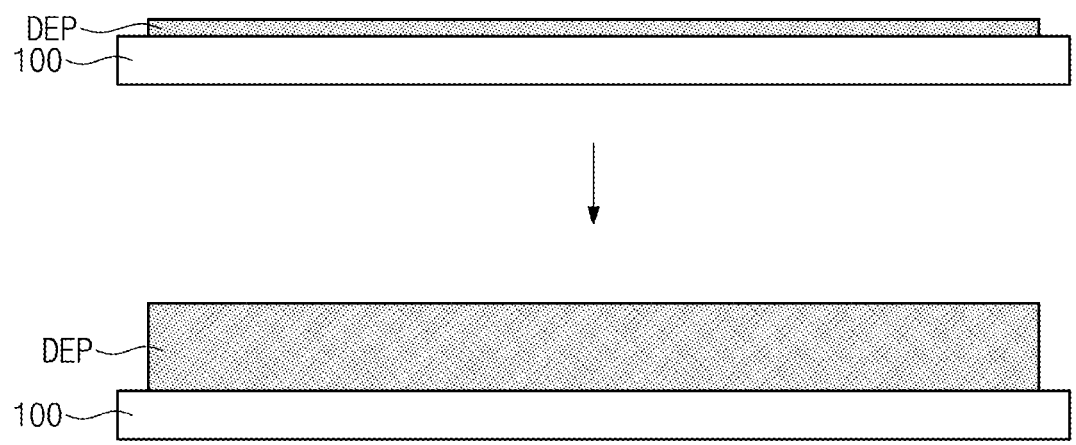
Figure 3C:
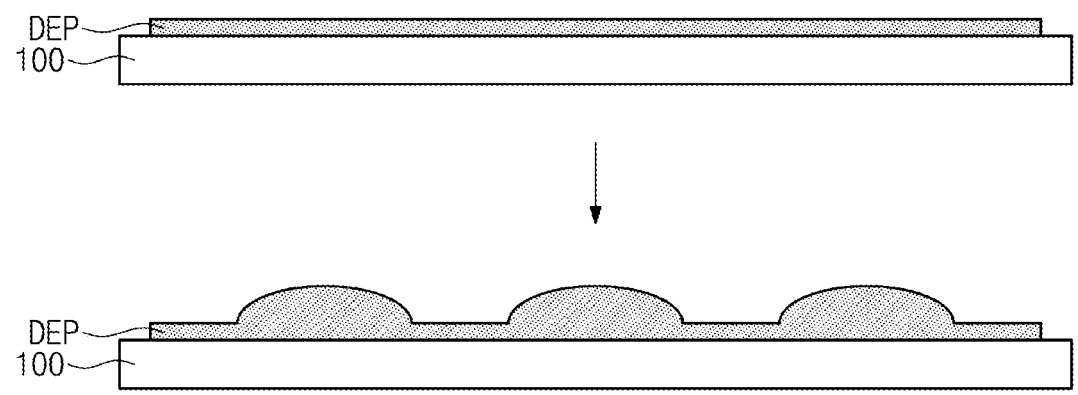

FIGS. 3A to 3C are cross-sectional views illustrating a mechanism when a deposition material is formed on a substrate.

FIG. 3A illustrates a Volmer-Weber mechanism in which a hemispherical structure is formed at an initial stage of the deposition by island growth of a deposition material DEP on the substrate 100 and gradually increases in size as the deposition material is grown. FIG. 3B illustrates a Frank-van der Merwe mechanism in which a deposition material DEP is deposited to be grown in the form of a film on the substrate 100 from an initial stage of the deposition. FIG. 3C illustrates a Stranski-Kranstanov mechanism in which a deposition material DEP is deposited in the form of a film on the substrate 100 at an initial stage of the deposition and then is grown in the form of an island.

Figure 4A:
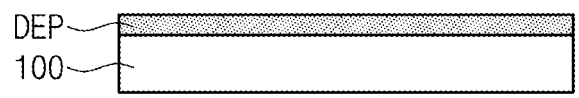
FIGS. 4A to 4C are cross-sectional views illustrating a wetting property of the deposition material according to surface energy.
Figure 4B:
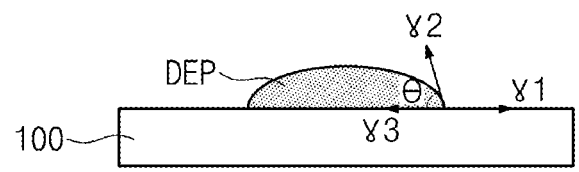
Figure 4C:
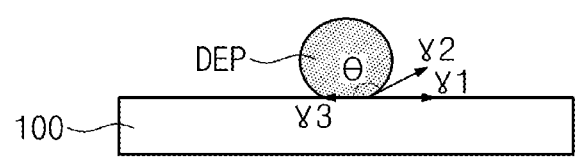

FIGS. 4A to 4C are cross-sectional views illustrating a wetting property of the deposition material according to surface energy. θ is a contact angle between the substrate 100 and the deposition material DEP, γ1 is surface energy of the substrate 100, γ2 is surface energy of the deposition material DEP, γ3 is an interfacial energy between the substrate 100 and the deposition material DEP. Here, the following relational expression is satisfied: $\gamma 1 = \gamma 2 \cos \theta + \gamma 3$ FIG. 4A illustrates a case in which the contact angle between the substrate 100 and the deposition material DEP is 0, which is in a complete wetting state. When the following relational expression: $\gamma 1 \geq \gamma 2 + \gamma 3$ is satisfied (θ=0), the deposition material DEP is deposited to be grown in the form of the film by the Frank-van der Merwe mechanism without being grown in the form of the island.

FIG. 4B illustrates a case in which the contact angle is an acute angle that corresponds to a partial wetting state. When the following relational expression: $\gamma 1 < \gamma 2 + \gamma 3$ is satisfied, the deposition material DEP is grown in the form of the island. That is, in order to allow the island pattern 310 to have the hemispherical shape on the substrate 100, the following relational expression: $\gamma 1 < \gamma 2 + \gamma 3$ has to be satisfied. Thus, γ2 that is the surface energy of the deposition material DEP may be high, and γ1 that is the surface energy of the substrate 100 may be low.

FIG. 4C illustrates a case in which the contact angle is an obtuse angle and is in a non-wetting state. The deposition material DEP is grown in the form of the island by satisfying the following relational expression: $\gamma 1 < \gamma 2 + \gamma 3$, but a value of γ1 is too small, so the size of the deposition material DEP may decrease, and adhesion with the substrate 100 may become weak to deteriorate optical properties. Thus, in order to form a hemispherical island pattern 310, the surface modification layer 200 may be formed on the substrate 100 to modify the surface energy of the substrate 100 to an appropriate range.

The surface modification layer 200 may include, for example, at least one of aluminum oxide and silicon oxide, but the material forming the surface modification layer 200 is not limited thereto. When the surface modification layer 200 includes oxide, the surface modification layer 200 may include amorphous oxide having surface energy less than that of crystalline oxide having high surface energy. The surface modification layer 200 may be formed on the substrate 100 using a deposition method. The surface energy of the surface modification layer 200 may be about 50 mJ/m$^2$ to about 1,000 mJ/m$^2$. As another example, the surface modification layer 200 may be omitted. In other words, the island pattern 310 may be provided on the substrate 100.

The island pattern 310 may be provided on the surface modification layer 200. A plurality of island patterns 310 may be provided on the surface modification layer 200. For example, the plurality of island patterns 310 may be regularly arranged at the same interval from each other on the surface modification layer 200 (see FIG. 1). As another example, the plurality of island patterns 310 may be irregularly arranged on the surface modification layer 200.

The island pattern 310 may have a hemispherical shape. A top surface of the island pattern 310 may have a curved profile. In other words, a top surface of the island pattern 310 may have a convex profile. Since the island pattern 310 has the hemispherical shape, properties such as luminance, a viewing angle, light extraction, light scattering, and light absorption of the optical device may be improved. Also, a size and curvature radius of the island pattern 310 may be adjusted according to the surface energy of the surface modification layer 200 and the deposition process. Thus the optical properties of the optical device may be relatively freely controlled according to the field of use.

The island pattern 310 may include an organic material. For example, the island pattern 310 may at least one of include phenyl, naphthalenyl, phenalthrenyl, biphenyl, quinolinyl, fluorenyl, phenylpyrazole, phenanthroline, quinodimethane, quinoxaline, indolocarbazole, carbazole, spirobifluorene, pyridine, thiophene, dibenzothiophene, furan, diazafluorene, benzofuropyridine, triazine, anthracene, pyrene, benzothiazolyl, coumarin, quinacridone, phenylpyridine, oxadiazole, phenoxazine, NPB(N, N'-Bis(naphthalen-1-yl)-N, N'-bis(phenyl)benzidine), or tetra-N-phenylbenzidine (TPB). As another example, the island pattern 310 may be an organic metal compound including at least one of sulfur (S), nitrogen (N), oxygen (O), fluorine (F), iodine (I), chlorine (Cl), bromine (Br), or phosphorus (P).

A melting point or sublimation point of the island pattern 310 may be about 360° C. or less. The island pattern 310 may have a vapor pressure of about 0.001 Torr or more at a temperature of about 360° C. The island pattern 310 may be formed on the surface modification layer 200 using the deposition method.

A capping layer 320 may be provided on the island pattern 310. The capping layer 320 may cover the island pattern 310. The capping layer 320 may be provided conformally on the island pattern 310. For example, a thickness of the capping layer 320 may be about 50 nm to about 1,000 nm. The capping layer 320 may be formed using a deposition method.

The capping layer 320 may include a convex portion 321 having a convex profile that is away from the surface modification layer 200 and a concave portion 322 that is in contact with the surface modification layer 200. The convex portion 321 may cover a top surface of the island pattern 310. The convex portion 321 may be in contact with the top surface of the island pattern 310. A profile of the top surface of the island pattern 310 may correspond to the profile of the convex portion 321. The concave portion 322 may be disposed at a level lower than the convex portion 321. The concave portion 322 may be interposed between the island patterns 310 adjacent to each other. The concave portion 322 may have a flat surface.

The capping layer 320 may include a material different from that of the island pattern 310. For example, the capping layer 320 may include oxide such as silicon oxide, aluminum oxide, titanium oxide, ITO, and AZO. As another example, the capping layer 320 may include a metal such as aluminum (Al), silver (Ag), gold (Au), platinum (Pt), nickel (Ni), and chromium (Cr). As another example, the capping layer 320 may include nitride such as silicon nitride, titanium nitride, and aluminum nitride. As another example, the capping layer 320 may include an organic material different from that of the island pattern 310. The capping layer 320 may include a porous material.

The capping layer 320 may include a material having a refractive index, reflectance, transmittance, electrical conductivity, a melting point, and mechanical properties, which are different from those of the island pattern 310. Since the capping layer 320 includes a material different from that of the island pattern 310, the optical properties, which are not provided in the island pattern 310, may be provided to the nano structure. For example, the nano structure may be improved in durability and increase in refractive index by the capping layer 320. As another example, when the capping layer 320 includes a porous material, the refractive index of the nano structure may be lowered. That is, the properties of the nano structure may also be freely controlled according to the material and properties of the capping layer 320.

A protective layer 400 may be provided on the capping layer 320. The protective layer 400 may include a high-density material such as silicon nitride or aluminum oxide. The protective layer 400 may function to protect the island pattern 310 and the capping layer 320. The protective layer 400 may be provided as a single layer or multi-layer. The protective layer 400 provided as the multi-layer may include both an inorganic material and an organic material. The protective layer 400 may be formed using a deposition method and/or a solution method. The protective layer 400 may also provide optical properties, which are not provided in the island pattern 310 and the capping layer 320, to the nano structure. As another example, the protective layer 400 may be omitted.

Figure 5:
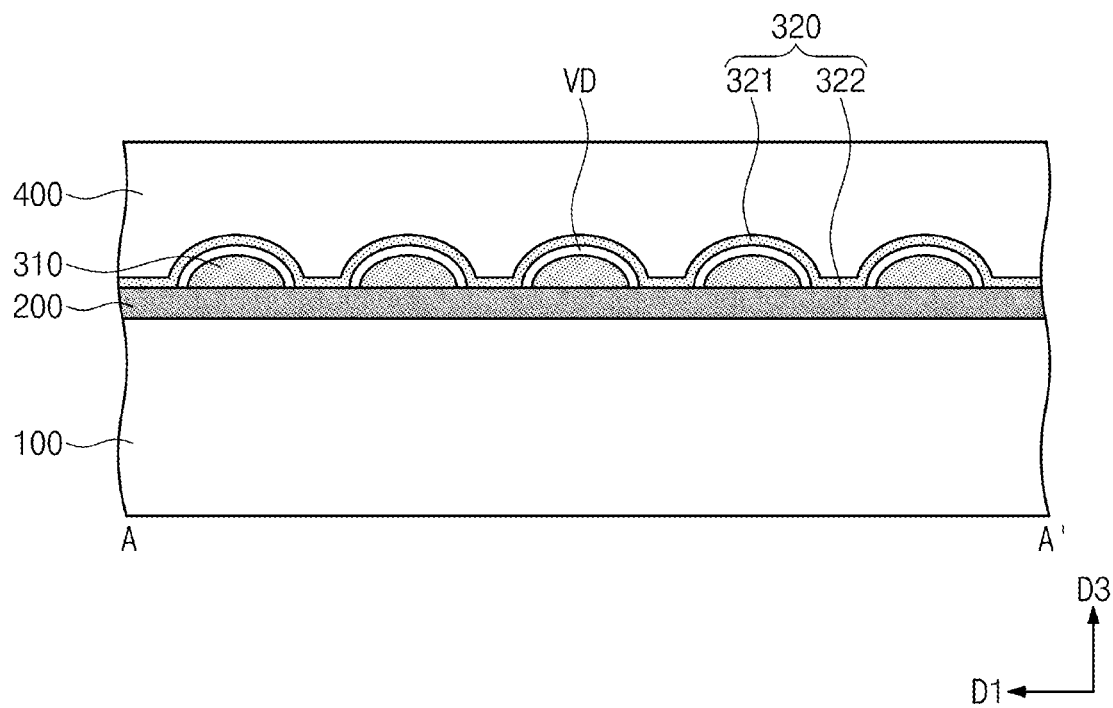
FIG. 5 is a cross-sectional view for explaining the nano structure, which is taken along line A-A' of FIG. 1, according to embodiments of the inventive concept.

FIG. 5 is a cross-sectional view for explaining the nano structure, which is taken along line A-A' of FIG. 1, according to embodiments of the inventive concept. Hereinafter, contents duplicated with the above-described contents will be omitted and differences will be described in detail.

Referring to FIGS. 1 and 5, the nano structure according to embodiments of the inventive concept may include a hollow VD. The hollow VD may be an empty space between the island pattern 310 and the capping layer 320. When the capping layer 320 includes the porous material, the vaporized island pattern 310 may be escaped through pores of the capping layer 320 so that the hollow VD is more easily formed.

For example, the island pattern 310 may be spaced apart from the capping layer 320 by the hollow VD. In other words, the island pattern 310 and the capping layer 320 may not be in contact with each other. The top surface of the island pattern 310 may have a profile corresponding to the profile of the convex portion 321. As another example, the hollow VD may be provided between the island pattern 310 and the capping layer 320, and a portion of the island pattern 310 may be in contact with the capping layer 320. The top surface of the island pattern 310 may not have a profile corresponding to the profile of the convex portion 321. A portion of the island pattern 310 may be in contact with the convex portion 321. The shape of each of the hollow VD and the island pattern 310 is not limited to that illustrated in the drawings and may have various shapes.

The protective layer 400 may provide optical properties, which are not provided in the island pattern 310 and the capping layer 320, to the nano structure. For example, the protective layer 400 may include silicon nitride. When the nano structure according to embodiments of the inventive concept includes the hollow VD, the protective layer 400 may be made of a material including silicon nitride having a high refractive index to improve a light scattering effect.

Figure 6:
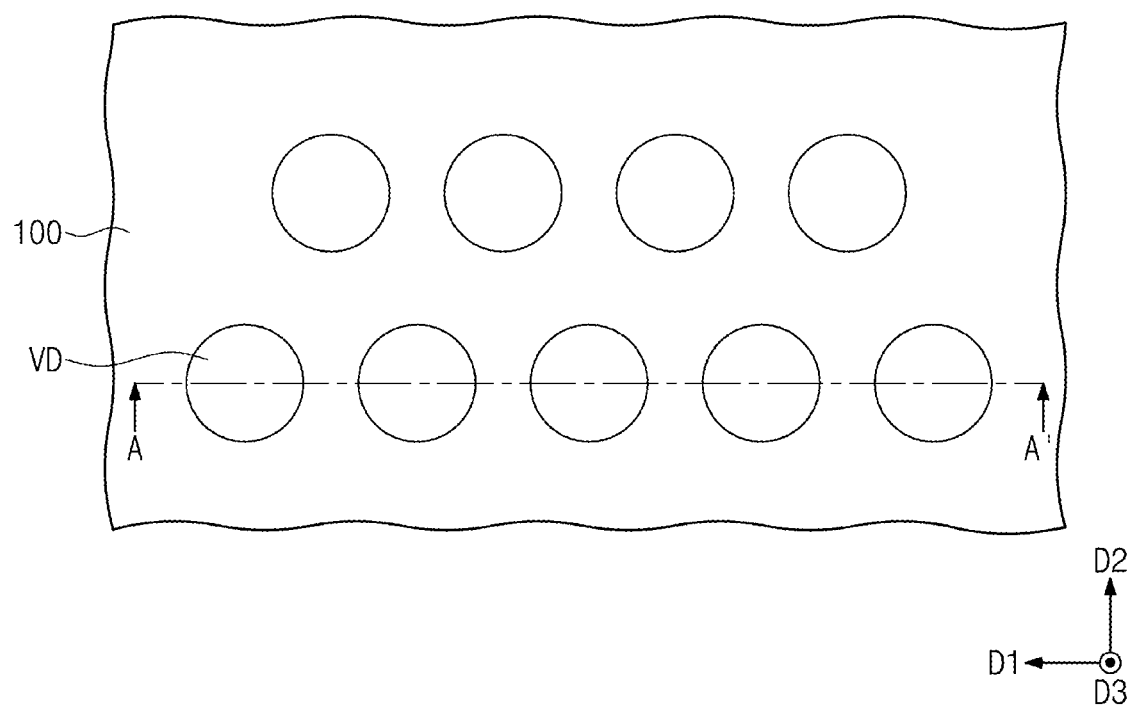
FIG. 6 is a plan view for explaining the nano structure according to embodiments of the inventive concept.
Figure 7:
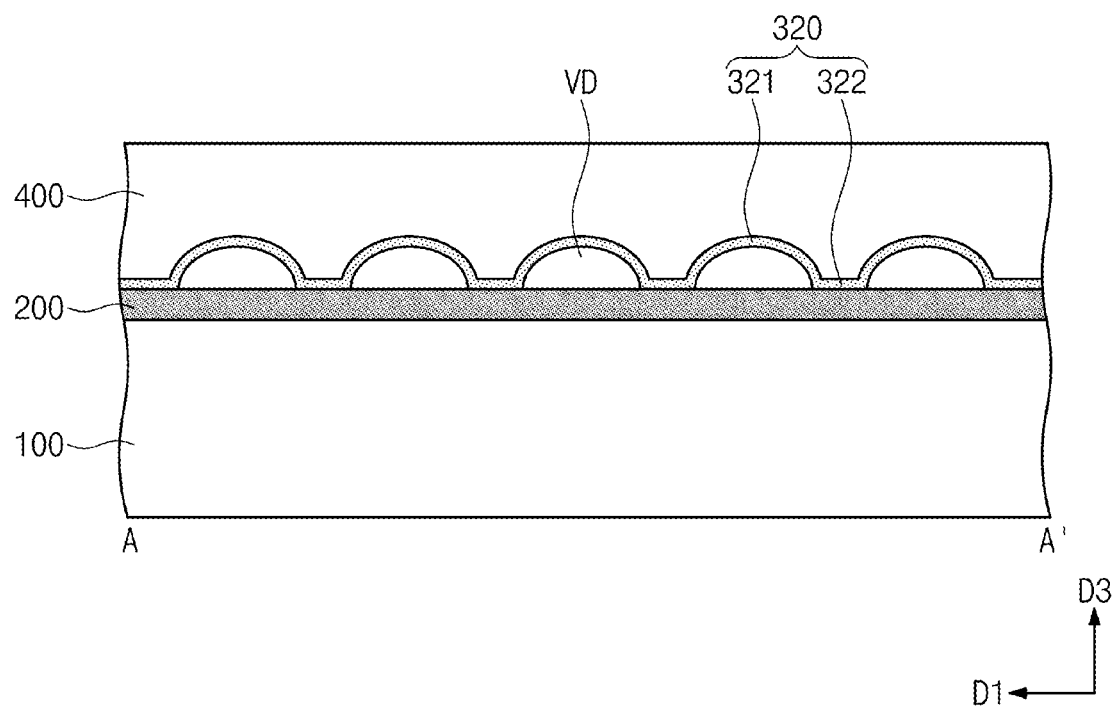
FIG. 7 is a cross-sectional view taken along line A-A' of FIG. 6.

FIG. 6 is a plan view for explaining the nano structure according to embodiments of the inventive concept. FIG. 7 is a cross-sectional view taken along line A-A' of FIG. 6. Hereinafter, contents duplicated with the above-described contents will be omitted and differences will be described in detail.

Referring to FIGS. 6 and 7, the nano structure according to embodiments of the present invention may include a hollow VD. The hollow VD may be an empty space provided between the surface modification layer 200 and the capping layer 320. That is, in this embodiment, the island pattern 310 may be completely removed. The hollow VD may be provided to reduce a refractive index of the nano structure, and thus, light scattering performance of the nano structure may be improved. In terms of a cross-sectional area, the hollow VD may have a hemispherical shape.

Figure 8:
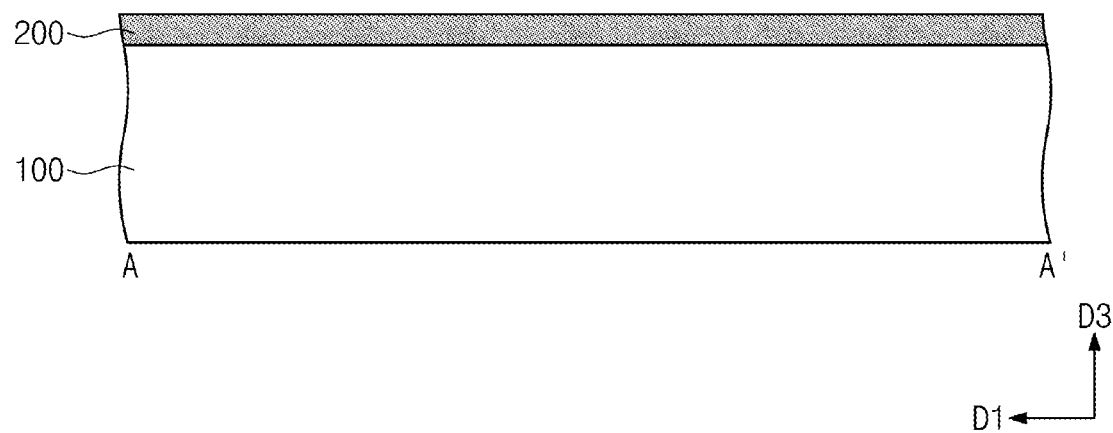
FIGS. 8 to 10 are a cross-sectional views for explaining a method for manufacturing a nano structure, respectively, which are taken along line A-A' of FIG. 1, according to embodiments of the inventive concept.
Figure 9:
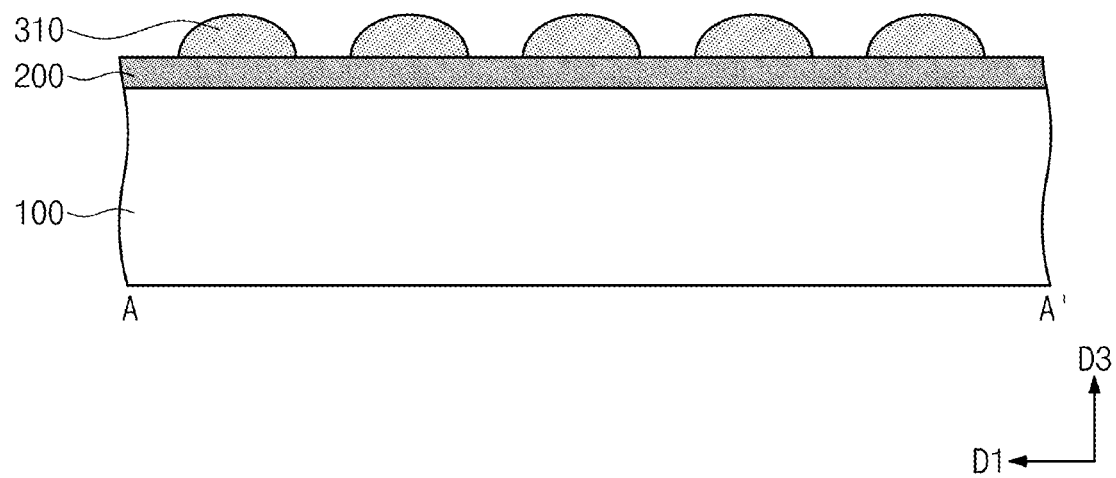
Figure 10:
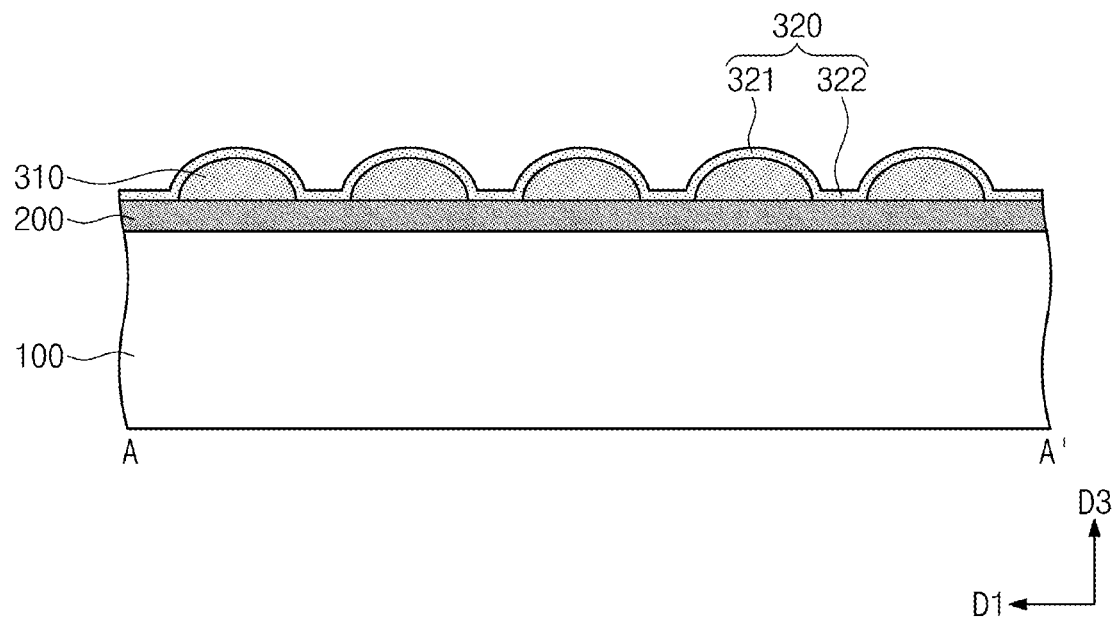

FIGS. 8 to 10 are a cross-sectional views for explaining a method for manufacturing the nano structure, respectively, which are taken along line A-A' of FIG. 1, according to embodiments of the inventive concept.

Referring to FIG. 8, a surface modification layer 200 may be formed on a substrate 100. For example, the substrate 100 may include at least one of materials such as glass, silicon, sapphire, polyimide, polyethylene terephthalate (PET), polystyrene (PS), polycarbonate (PC), polyvinyl chloride (PVC), and stainless steel.

The surface modification layer 200 may be formed to modify surface energy of the substrate 100. The surface modification layer 200 may be formed using a deposition method. For example, the surface modification layer 200 may be formed by at least one process of a chemical vapor deposition method (CVD), an atomic layer deposition method (ALD), a thermal evaporation method, or a sputtering process. The surface modification layer 200 may include at least one of aluminum oxide or silicon oxide.

Referring to FIG. 9, an island pattern 310 may be formed on the surface modification layer 200. The island pattern 310 may include an organic material or an organic metal compound. For example, a plurality of island patterns 310 may be formed on the surface modification layer 200 with regular pitches. As another example, a plurality of island patterns 310 may be irregularly formed on the surface modification layer 200.

The island pattern 310 may be formed using a deposition method. For example, the island pattern 310 may be formed using at least one of organic vapor phase deposition (OVPD) or thermal evaporation. The island pattern 310 may include an organic material. The island pattern 310 may be grown on the surface modification layer 200 through a Volmer-Weber mechanism. The island pattern 310 may be formed to have a hemispherical shape. A size and curvature radius of the island pattern 310 may be adjusted.

Referring to FIG. 10, a capping layer 320 may be formed on the island pattern 310. The capping layer 320 may be provided conformally on the island pattern 310. The capping layer 320 may have a thickness of about 50 nm to about 1,000 nm. The capping layer 320 may be formed using a deposition method. For example, the capping layer 320 may be formed by using at least one process of a chemical vapor deposition method (CVD), an atomic layer deposition method (ALD), a thermal evaporation method, an organic vapor phase deposition method (OVPD), or a sputtering method.

The capping layer 320 may include a convex portion 321 having a convex profile away from the surface modification layer 200 and a concave portion 322 that is in contact with the surface modification layer 200. The convex portion 321 may cover a top surface of the island pattern 310. The concave portion 322 may be disposed at a level lower than the convex portion 321. The concave portion 322 may be interposed between the island patterns 310 adjacent to each other. The concave portion 322 may have a flat surface.

The capping layer 320 may include a material different from that of the island pattern 310. For example, the capping layer 320 may include oxide such as silicon oxide, aluminum oxide, titanium oxide, ITO, and AZO. As another example, the capping layer 320 may include a metal such as aluminum (Al), silver (Ag), gold (Au), platinum (Pt), nickel (Ni), and chromium (Cr). As another example, the capping layer 320 may include nitride such as silicon nitride, titanium nitride, and aluminum nitride. As another example, the capping layer 320 may include an organic material different from that of the island pattern 310. The capping layer 320 may include a porous material.

Referring back to FIG. 2, a protective layer 400 may be formed on the capping layer 320. The protective layer 400 may include a high-density material such as silicon nitride or aluminum oxide. The protective layer 400 may be provided as a single layer or multi-layer. The protective layer 400 provided as the multi-layer may include both an inorganic material and an organic material. The protective layer 400 may be formed using a deposition method and/or a solution method. For example, the protective layer 400 may be formed by using at least one process of a chemical vapor deposition method (CVD), an atomic layer deposition method (ALD), a thermal evaporation method, or a sputtering method. As another example, the protective layer 400 may be formed using at least one process of spin coating, dip coating, spray coating, or inkjet coating.

Figure 11:
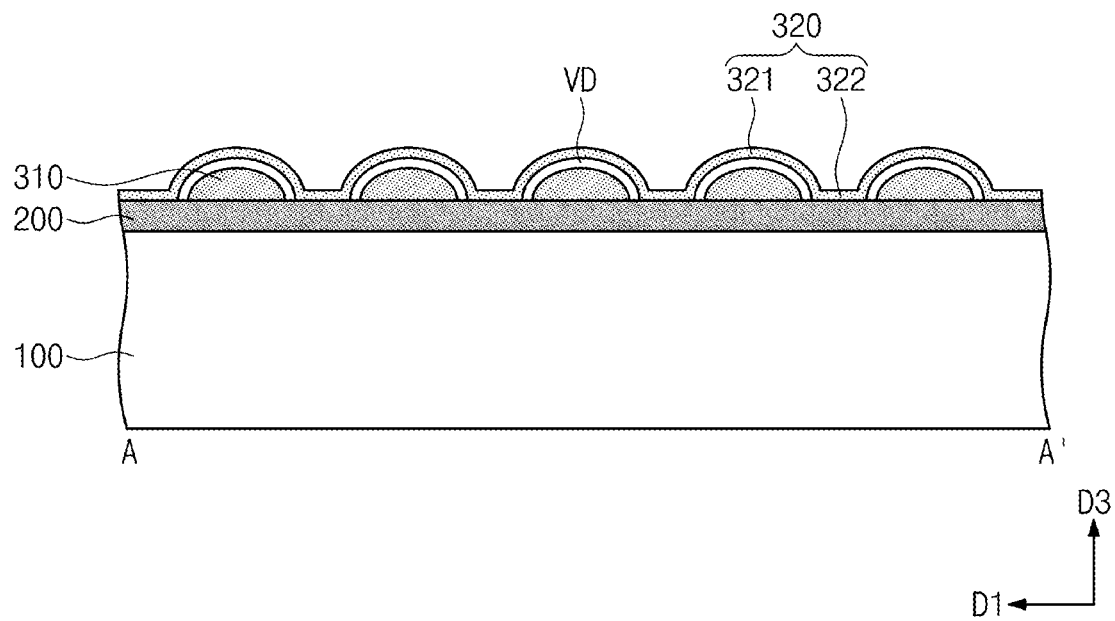
FIG. 11 is a cross-sectional view for explaining a method for manufacturing a nano structure, which is taken along line A-A' of FIG. 1, according to embodiments of the inventive concept.

FIG. 11 is a cross-sectional view for explaining a method for manufacturing a nano structure, which is taken along line A-A' of FIG. 1, according to embodiments of the inventive concept.

Referring to FIG. 11, after performing the process described with reference to FIGS. 8 to 10, a process of forming the hollow VD may be performed by removing a portion of the island pattern 310.

The process of forming the hollow VD by removing the portion of the island pattern 310 may be performed using at least one of an annealing process or a plasma treating process. For example, after forming the capping layer 320, a portion of the island pattern 310 may be removed by thermally treating the nano structure at a temperature of about 120° C. or higher under a vacuum atmosphere. The hollow VD may be an empty space formed by removing a portion of the island pattern 310. A plasma treating process may also be performed together with the annealing process. Here, since a melting point of the capping layer 320 is higher than that of the island pattern 310, the structure of the capping layer 320 may not be changed, unlike the island pattern 310. In order to remove the island pattern 310, the capping layer 320 may include a porous material.

As another example, when the capping layer 320 is deposited on the island pattern 310 without a separate post-processing process, a portion of the island pattern 310 is volatilized to form a hollow VD between the capping layer 320 and the island pattern 310.

The island pattern 310 may be spaced apart from the capping layer 320 by the hollow VD. In other words, the island pattern 310 and the capping layer 320 may not be in contact with each other. The top surface of the island pattern 310 may have a profile corresponding to the profile of the convex portion 321. Although not shown, as another example, the hollow VD may be provided between the island pattern 310 and the capping layer 320, and a portion of the island pattern 310 may be in contact with the capping layer 320. The top surface of the island pattern 310 may not have a profile corresponding to the profile of the convex portion 321. A portion of the island pattern 310 may be in contact with the convex portion 321. The shape of each of the hollow VD and the island pattern 310 is not limited to that illustrated in the drawings and may have various shapes.

Referring back to FIG. 5, a protective layer 400 may be formed on the capping layer 320. The process of forming the protective layer 400 may be substantially the same as the process described with reference to FIG. 2.

Figure 12:
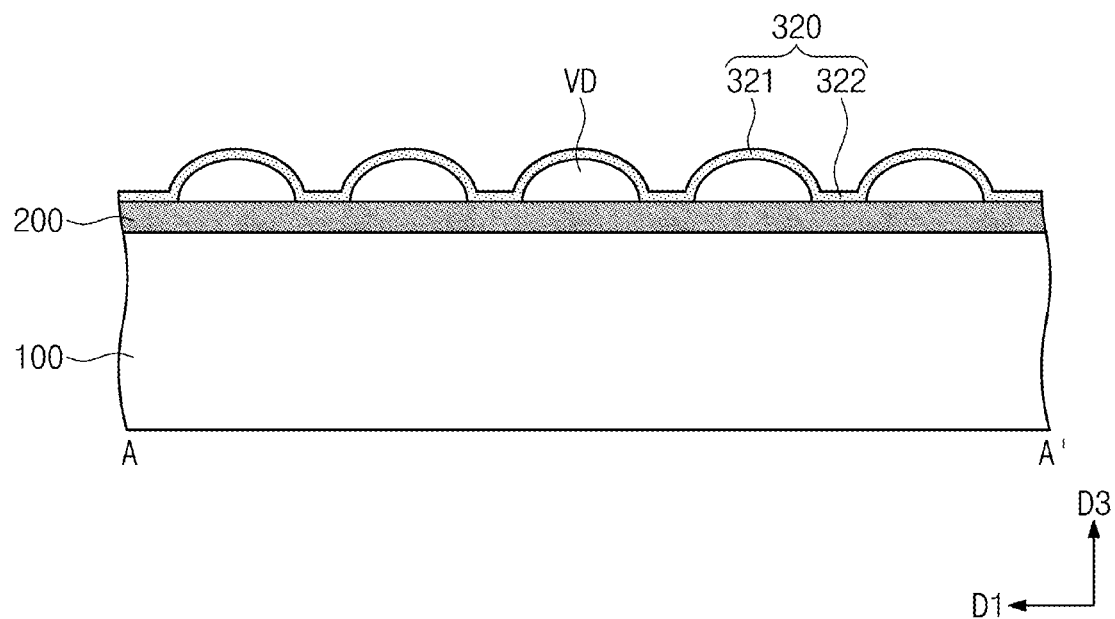
FIG. 12 is a cross-sectional view for explaining a method for manufacturing a nano structure, which is taken along line A-A' of FIG. 6, according to embodiments of the inventive concept.

FIG. 12 is a cross-sectional view for explaining a method for manufacturing a nano structure, which is taken along line A-A' of FIG. 6, according to embodiments of the inventive concept.

Referring to FIG. 12, after performing the process described with reference to FIGS. 8 to 10, the process of forming the hollow VD may be performed by removing the entire island pattern 310.

The process of removing the entire island pattern 310 to form the hollow VD may be performed using at least one process of an annealing process or a plasma treating process. For example, after forming the capping layer 320, the entire island pattern 310 may be removed by thermally treating the nano structure at a temperature of about 120° C. or higher under a vacuum atmosphere. The hollow VD may be an empty space formed by removing the entire island pattern 310. That is, the hollow VD may be an empty space formed between the surface modification layer 200 and the capping layer 320. A plasma treating process may also be performed together with the annealing process. Here, since a melting point of the capping layer 320 is higher than that of the island pattern 310, the structure of the capping layer 320 may not be changed. In terms of a cross-sectional area, the hollow VD may have a hemispherical shape.

According to the embodiments of the inventive concept, the nano structure may be formed through the relatively simple process such as the annealing process without using the complicated process such as the photolithography and an imprint process to simplify the process and prevent the deterioration in property of the optical device.

Since the nano structure according to the embodiment of the inventive concept is formed using the deposition method, the nano structure may be formed through the relatively simple process. In addition, the capping layer may be provided to more freely control the optical properties and also improve the durability.

The object of the present invention is not limited to the aforesaid, but other objects not described herein will be clearly understood by those skilled in the art from descriptions below.

Although the embodiment of the inventive concept is described with reference to the accompanying drawings, those with ordinary skill in the technical field of the inventive concept pertains will be understood that the present disclosure can be carried out in other specific forms without changing the technical idea or essential features. Therefore, the above-disclosed embodiments are to be considered illustrative and not restrictive.

What is claimed is:

1. A nano structure for controlling optical properties of an optical device, the nano structure comprising:
   a substrate;
   a surface modification layer provided on the substrate to modify surface energy of the substrate;
   an island pattern provided on the surface modification layer;
   a capping layer provided on the island pattern and the surface modification layer; and
   a hollow portion provided between the island pattern and the capping layer,
   wherein the capping layer comprises:
      a convex portion having a convex profile that is disposed on the island pattern; and
      a concave portion that is disposed on the surface modification layer to be in contact with the surface modification layer;
   wherein the hollow portion is provided along an outer peripheral surface of the island pattern, separating the convex portion from the island pattern, and
   wherein the capping layer has a melting point higher than a melting point of the island pattern.

2. The nano structure claim 1, wherein a profile of a top surface of the island pattern corresponds to a profile of the convex portion.

3. The nano structure claim 1, wherein the island pattern and the capping layer comprise materials different from each other.

4. The nano structure claim 1, wherein the island pattern comprises an organic material.

5. The nano structure claim 1, wherein the capping layer has a thickness of about 50 nm to about 1,000 nm.

6. The nano structure claim 1, further comprising a protective layer on the capping layer.

7. The nano structure claim 1, wherein the surface modification layer has surface energy of about 50 mJ/m$^2$ to about 1,000 mJ/m$^2$.

8. A method for manufacturing a nano structure for controlling optical properties of an optical device, the method comprising:
   forming a surface modification layer, which modifies surface energy of a substrate, on the substrate;
   forming an island pattern on the surface modification layer; and
   forming a capping layer on the island pattern and the surface modification layer; and
   forming a hollow portion between the island pattern and the capping layer using a thermal process of the island pattern after forming the capping layer,
   wherein the capping layer comprises:
      a convex portion configured to cover a top surface of the island pattern; and
      a concave portion that is formed on the surface modification layer to be in contact with the surface modification layer, and
   wherein the hollow portion is formed along an outer peripheral surface of the island pattern, separating the convex portion from the island pattern, and
   wherein the capping layer has a melting point higher than a melting point of the island pattern.

9. The method of claim 8, wherein the surface modification layer, the island pattern, and the capping layer are formed using a deposition method.

10. The method of claim 8, wherein the removing of the island pattern is performed using an annealing process or a plasma treating process.

11. The method of claim 8, wherein the forming of the hollow comprising removing a portion of the island pattern.

12. The method of claim 8, further comprising forming a protective layer on the nano structure.

\* \* \* \* \*